United States Patent
Feezell et al.

(10) Patent No.: US 8,211,723 B2
(45) Date of Patent: *Jul. 3, 2012

(54) AL(X)GA(1-X)N-CLADDING-FREE NONPOLAR III-NITRIDE BASED LASER DIODES AND LIGHT EMITTING DIODES

(75) Inventors: Daniel F. Feezell, Santa Barbara, CA (US); Mathew C. Schmidt, Santa Barbara, CA (US); Kwang-Choong Kim, Seoul (KR); Robert M. Farrell, Goleta, CA (US); Daniel A. Cohen, Santa Barabra, CA (US); James S. Speck, Goleta, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 330 days.

This patent is subject to a terminal disclaimer.

(21) Appl. No.: 12/030,117

(22) Filed: Feb. 12, 2008

(65) Prior Publication Data

US 2008/0191192 A1 Aug. 14, 2008

Related U.S. Application Data

(60) Provisional application No. 60/889,510, filed on Feb. 12, 2007.

(51) Int. Cl.
*H01L 21/00* (2006.01)
*H01L 29/06* (2006.01)

(52) U.S. Cl. . 438/31; 257/14; 257/E21.09; 257/E23.008
(58) Field of Classification Search ............. 257/13–14, 257/E33.008, E21.09, E29.168, E33.032; 438/46, 475, 31
See application file for complete search history.

(56) References Cited

U.S. PATENT DOCUMENTS

| | | | |
|---|---|---|---|
| 6,621,845 B2 | 9/2003 | Fukunaga | |
| 7,091,514 B2 | 8/2006 | Craven et al. | |
| 7,847,280 B2 * | 12/2010 | Yamada et al. | 257/14 |
| 2005/0040385 A1 | 2/2005 | Craven et al. | |
| 2005/0214992 A1 * | 9/2005 | Chakraborty et al. | 438/172 |
| 2005/0224781 A1 * | 10/2005 | Kneissl et al. | 257/14 |
| 2006/0205199 A1 | 9/2006 | Baker et al. | |
| 2006/0270200 A1 | 11/2006 | Shibata | |

OTHER PUBLICATIONS

Asano, T. et al., "100-mW kink-free blue-violet laser diodes with low aspect ratio," IEEE Journal of Quantum Electronics, Jan. 2003, pp. 135-140, vol. 39, No. 1.

Bernardini, V. et al., "Spontaneous polarization and piezoelectric constants of III-V nitrides," Physical Review B, Oct. 1997, pp. 10024-10027, vol. 56, No. 16.

(Continued)

*Primary Examiner* — Hoa B Trinh
(74) *Attorney, Agent, or Firm* — Gates & Cooper LLP

(57) ABSTRACT

A method for fabricating $Al_xGa_{1-x}N$-cladding-free nonpolar III-nitride based laser diodes or light emitting diodes. Due to the absence of polarization fields in the nonpolar crystal planes, these nonpolar devices have thick quantum wells that function as an optical waveguide to effectively confine the optical mode to the active region and eliminate the need for Al-containing waveguide cladding layers.

26 Claims, 3 Drawing Sheets

OTHER PUBLICATIONS

Nakamura, S. et al., "InGaN/Gan/AlGaN-based laser diodes with modulation-doped strained-layer superlattices grown on an epitaxially laterally grown GaN substrate," Appl. Phys. Lett., Jan. 12, 1998, pp. 211-213, vol. 72, No. 2.

Uchida, S. et al., "Recent progress in high-power blue-violet lasers," IEEE Journal of Selected Topics in Quantum Electronics, Sep./Oct. 2003, pp. 1252-1259, vol. 9, No. 5.

Waltereit, P. et al., "Nitride semiconductors free of electronic fields for efficient white light-emitting diodes," Nature, Aug. 2000, pp. 865-868, vol. 406.

International Search Report mailed Jul. 2, 2008, International application No. PCT/US2008/001840.

\* cited by examiner

AL(X)GA(1-X)N-CLADDING-FREE NONPOLAR III-NITRIDE BASED LASER DIODES AND LIGHT EMITTING DIODES

CROSS-REFERENCE TO RELATED APPLICATION

This application claims the benefit under 35 U.S.C. Section 119(e) of the following and commonly-assigned U.S. patent application:

U.S. Provisional Application Ser. No. 60/889,510, filed on Feb. 12, 2007, by Daniel F. Feezell, Mathew C. Schmidt, Kwang Choong Kim, Robert M. Farrell, Daniel A. Cohen, James S. Speck, Steven P. DenBaars, and Shuji Nakamura, entitled "Al(x)Ga(1-x)N-CLADDING-FREE NONPOLAR GAN-BASED LASER DIODES AND LEDS,"

which application is incorporated by reference herein.

BACKGROUND OF THE INVENTION

1. Field of the Invention

The present invention is related to $Al_xGa_{1-x}N$-cladding-free nonpolar III-nitride based laser diodes (LDs) and light emitting diodes (LEDs).

2. Description of the Related Art (Note: This application references a number of different publications as indicated throughout the specification by one or more reference numbers within parentheses, e.g., (Ref. X). A list of these different publications ordered according to these reference numbers can be found below in the section entitled "References." Each of these publications is incorporated by reference herein.)

At this time, existing gallium nitride (GaN) based edge-emitting LDs are usually c-plane structures (Refs. 1-3). These devices have found applications in several consumer products. However, to achieve effective optical mode confinement in these devices, the inclusion of aluminum-containing (Al-containing) waveguide cladding layers, such as $Al_xGa_{1-x}N$/GaN superlattices, is required. These $Al_xGa_{1-x}N$/GaN superlattices present significant epitaxial growth challenges, reduce the epitaxial material quality, and increase the operating voltage of the device. Superlattice growth also poses significant problems for reactor stability and reproducibility.

Additionally, due to their orientation along the polar c-plane, these devices suffer from the quantum confined Stark effect (QCSE), which spatially separates the electron and hole wave functions and limits their radiative efficiency (Ref. 4). This results in the requirement for thin quantum wells, which are generally less than 40 angstroms (Å) in thickness, and typically have a thickness that ranges between 25-40 angstroms.

Unlike GaN-based optoelectronic devices grown on c-plane substrates, structures grown on nonpolar substrates (e.g., m-plane or a-plane) do not suffer from polarization-related electric fields, since the polar c-axis is parallel to any heterointerfaces (Ref. 5). Thus, the present invention implements thicker quantum wells using nonpolar Group-III nitride (III-nitride) structures, due to the lack of polarization fields. Moreover, these thicker quantum wells are thick enough to function as an effective optical waveguide in a laser diode, and thus no substrate with a lower index of refraction is close to the optical mode, which allows for the removal of the troublesome $Al_xGa_{1-x}N$/GaN superlattices that are required for optical guiding in similar devices grown on c-plane substrates.

SUMMARY OF THE INVENTION

To overcome the limitations in the prior art described above, and to overcome other limitations that will become apparent upon reading and understanding the present specification, the present invention discloses an optoelectronic device and method for making same, comprising a nonpolar III-nitride semiconductor laser diode or light emitting diode having at least one nonpolar III-nitride quantum well with a thickness of at least 4 nanometers (nm), wherein the nonpolar III-nitride quantum well active region provides sufficient optical confinement for the device's operation in the absence of Al-containing cladding layers.

Preferably, the device includes no Al-containing waveguide cladding layers, or alternatively, the device includes Al-free waveguide cladding layers, or alternatively, any Al-containing waveguide cladding layers included in the device have an Al content less than or equal to 10%. Any Al-containing layers present in the device do not confine the optical mode of the device.

Instead, the quantum well active region functions as an optical waveguide for the device. Specifically, the quantum well active region provides enough material with a high index of refraction to effectively confine an optical mode of the device.

In addition, the substrate of the device does not have a substantial effect on the optical mode of the device, even though the substrate of the device has an index of refraction lower than the quantum well active region.

BRIEF DESCRIPTION OF THE DRAWINGS

Referring now to the drawings in which like reference numbers represent corresponding parts throughout.

DETAILED DESCRIPTION OF THE INVENTION

Figure 1:
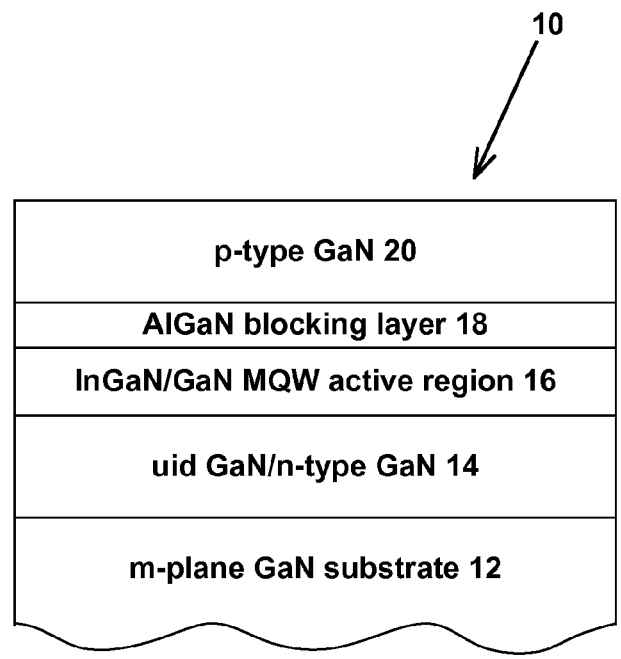
FIG. 1 is an example of an epitaxial layer structure for an $Al_xGa_{1-x}N$-cladding-free m-plane laser diode according to one embodiment of the present invention.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The present invention describes a III-nitride based light emitting device, e.g., a laser diode or light emitting diode, that does not have Al-containing waveguide cladding layers, and a method for making these devices. Specifically, $Al_xGa_{1-x}N$/GaN superlattices, bulk $Al_xGa_{1-x}N$, or other layers with any mole fraction of Al, need not be used to clad the optical waveguide. Moreover, any Al-containing layers present in the device do not confine the optical mode of the device.

In the preferred embodiment, a free-standing, nonpolar, III-nitride substrate is used as the substrate for the device. Due to the absence of polarization fields in the nonpolar crystal planes, devices grown on nonpolar substrate orientations can utilize thick InGaN quantum wells in the active region and still demonstrate high-gain operation. Due to the increased thickness of the quantum wells allowed in nonpolar structures, and the absence of a lower index of refraction substrate, these quantum wells can function as an optical waveguide layer in a laser diode structure. Specifically, several thick InGaN quantum wells provide enough material with a high index of refraction to effectively confine the optical mode to the active region of the device.

This structure is attractive because there is no requirement for Al-containing (specifically $Al_xGa_{1-x}N$) waveguide cladding layers for optical mode confinement. This is in contrast to laser diodes grown using conventional c-plane GaN, where the spontaneous and piezoelectric fields preclude the use of thick InGaN quantum wells, and Al-containing waveguide cladding layers, such as $Al_xGa_{1-x}N$/GaN superlattice regions, are required to achieve effective optical mode guiding. Furthermore, the quantum well active region in conventional c-plane GaN devices cannot be used for effective optical guiding due to the presence of a sapphire substrate with a lower index of refraction, which tends to force a higher order mode unless $Al_xGa_{1-x}N$/GaN superlattices are present.

In the present invention, the elimination of Al-containing waveguide cladding layers allows for the fabrication of III-nitride based laser diodes much in the same fashion as III-nitride based light emitting diodes.

The elimination of Al-containing waveguide cladding layers allows for simpler epitaxial growth techniques, improved manufacturability and higher performance devices. For example, the elimination of Al-containing waveguide cladding layers in laser diode structures helps reduce problems with tensile strain and cracking typically associated with the Al-containing waveguide layers, produces higher crystal quality material, and leads to devices with reduced voltage operation, lower threshold current densities and longer lifetimes.

These advantages will potentially lower the cost of a variety of commercial products. Consequently, these device structures are expected to find utility in the same applications as c-plane GaN-based laser diodes, and thus may be used as an optical source for various commercial, industrial, or scientific applications. Thus, this invention is relevant to the development of high brightness and high resolution lighting displays, high resolution or high throughput printers, next generation DVD players, efficient solid-state lighting, optical sensing, and medical products.

Epitaxial Layer Structure

FIG. 1 illustrates an epitaxial layer structure for an exemplary $Al_xGa_{1-x}N$-cladding-free m-plane laser diode according to one embodiment of the present invention. The epitaxial layer structure is comprised of alloys such as, but not limited to, (Ga, In, Al)N, i.e., Group-III nitrides. However, other structures, different combinations of layers, and alternative embodiments are possible without departing from the scope of this invention.

The exemplary device 10 is grown on an freestanding, m-plane GaN substrate 12, and includes an unintentionally doped and/or n-type GaN layer 14, a quantum well active region 16, an $Al_xGa_{1-x}N$ electron blocking layer 18, and a p-type GaN layer 20. The device 10 may be fabricated using well-established semiconductor device fabrication techniques.

The quantum well active region 16 may contain a single quantum well or multiple quantum wells. Preferably, the quantum wells 16 are of sufficient thickness to effectively confine the optical mode. In one embodiment, the quantum wells 16 are thicker than those typically implemented in c-plane structures, namely, the quantum wells 16 have a thickness of at least 40 angstroms (4 nm), preferably greater than 40 angstroms (4 nm), and more preferably greater than 50, 60, 70 or 80 angstroms (5, 6, 7, or 8 nm).

Because of the thickness of the quantum wells 16, the device 10 does not require any Al-containing waveguide cladding layers. Specifically, there is no need for $Al_xGa_{1-x}N$/GaN superlattices, bulk $Al_xGa_{1-x}N$, or other layers with any mole fraction of Al, to create an optical waveguide. Indeed, in the exemplary device 10, the only Al-containing layer is the $Al_xGa_{1-x}N$ electron blocking layer 18, which does not confine the optical mode.

Operation of the Device

Figure 2:
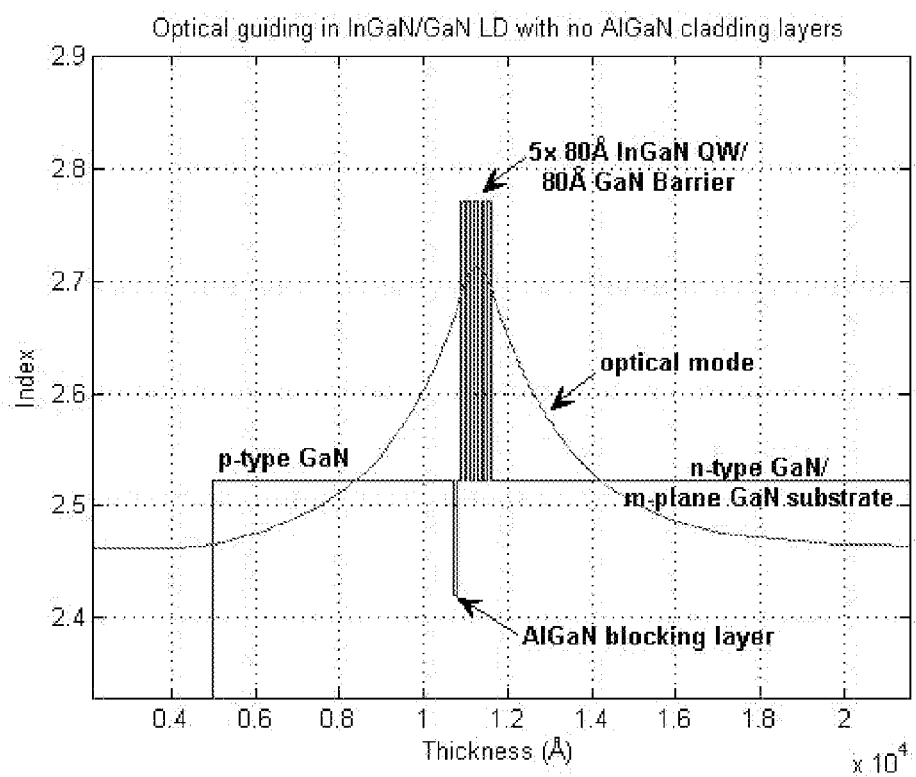
FIG. 2 is a graph that shows an optical mode and index of refraction profile in the proposed $Al_xGa_{1-x}N$-cladding-free m-plane GaN-based laser diode (LD).

FIG. 2 is a graph of the index of refraction profile v. quantum well thickness that shows the optical mode for an $Al_xGa_{1-x}N$-cladding-free m-plane GaN-based laser diode (LD) according to one embodiment of the present invention. The optical mode is effectively guided by the thick InGaN/GaN multiple quantum wells (MQWs). The laser structure contains no $Al_xGa_{1-x}N$ based cladding layers, or other Al-containing layers.

In this example, the active region is comprised of five 8 nm InGaN quantum well layers (labeled as 5×80 Å InGaN QW in the figure) sandwiched between or intermixed with six 8 nm GaN barrier layers (labeled as 80 Å GaN Barrier in the figure). These thick quantum wells effectively confine the optical mode to the active region of the device without the need for Al-containing waveguide cladding layers. The only Al-containing layer is a thin (10 nm or less) $Al_xGa_{1-x}N$ electron blocking layer, which is not used to confine the optical mode.

The implementation of the proposed epitaxial structure to produce various categories of GaN-based laser diodes is a key aspect of the invention. This epitaxial structure may be fabricated into a variety of $Al_xGa_{1-x}N$-cladding-free nonpolar (m-plane, a-plane) GaN-based laser diodes using standard semiconductor processing techniques. These include, but are not limited to, $Al_xGa_{1-x}N$-cladding-free nonpolar broad-area edge-emitting lasers, ridge laser diodes, double heterostructure laser diodes, and distributed feedback (DFB) laser diodes. These devices also encompass lasers with etched facets or cleaved facets.

Fabrication Process

Figure 3:
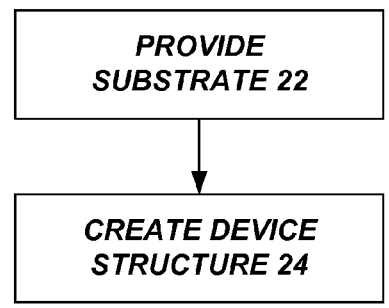
FIG. 3 is a flowchart that illustrates one embodiment of the fabrication process for a device of the present invention.

FIG. 3 is a flowchart that illustrates one embodiment of a process for fabricating an optoelectronic device, comprising a nonpolar III-nitride semiconductor laser diode or light emitting diode having at least one nonpolar III-nitride quantum well active with a thickness of at least 4 nanometers, wherein the nonpolar III-nitride quantum well active region provides sufficient optical confinement for the device's operation in the absence of Al-containing cladding layers. The fabrication of the device may use well-established semiconductor device processing techniques, including lithography, etching and deposition processes.

Block 22 represents the step of providing a substrate, such as a nonpolar freestanding III-nitride substrate.

Block 24 represents the step of creating the device structure on the substrate, which may include fabricating an unintentionally doped and/or n-type III-nitride layer, a III-nitride quantum well active region, and a p-type III-nitride layer. Other layers may be included as well.

The end result of these steps is the device structure, such as the structure shown in FIG. 1.

Preferably, the quantum wells have a thickness of at least 40 angstroms (4 nm), preferably greater than 40 angstroms (4 nm), and more preferably greater than 50, 60, 70 or 80 angstroms (5, 6, 7, or 8 nm). In the present invention, the nonpolar III-nitride quantum well with a thickness of at least 4 nanometers provides greater optical confinement than a nonpolar III-nitride quantum well with a thickness of less than 4 nanometers.

The device includes no Al-containing waveguide cladding layers, or alternatively, the device includes Al-free waveguide cladding layers, or alternatively, any Al-containing waveguide cladding layers included in the device have an Al content less than or equal to 10%. Any Al-containing layers present in the device do not confine the optical mode of the device.

Instead, the quantum well active region functions as an optical waveguide for the device. Specifically, the quantum well active region provides enough material with a high index of refraction to effectively confine an optical mode of the device.

In addition, the substrate of the device does not have a substantial effect on the optical mode of the device, even though the substrate of the device has an index of refraction lower than the quantum wells.

Possible Modifications and Variations

The term "$Al_xGa_{1-x}N$-cladding-free" refers to the absence of waveguide cladding layers containing any mole fraction of Al, such as $Al_xGa_{1-x}N$/GaN superlattices, bulk $Al_xGa_{1-x}N$, or AlN. Other layers not used for optical guiding may contain some quantity of Al. For example, an $Al_xGa_{1-x}N$ electron blocking layer may be present.

Although "GaN-based" devices are described herein, the invention can be applied to devices containing any Group-III nitride semiconductor materials, namely (Ga, In, Al)N, including but not limited to Ga, In, Al, and N, and combinations thereof. For example, the quantum wells may comprise InGaN.

Growth of $Al_xGa_{1-x}N$-cladding-free laser diodes may also be practiced on (Ga, In, Al)N crystal orientations other than m-plane or a-plane. The scope of this invention includes the growth and fabrication of $Al_xGa_{1-x}N$-cladding-free laser diodes on all possible crystallographic orientations of (Ga, In, Al)N.

These crystallographic orientations include the "nonpolar planes" of the crystal, such as the {11-20} planes, known collectively as a-planes, and the {1-100} planes, known collectively as m-planes. These crystallographic orientations also include the semipolar planes of the crystal due to the minimal polarization effects for these orientations. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index.

For more information on these nonpolar and semipolar crystallographic orientations, refer to U.S. Patent Application Publication No. 2007/0093073, U.S. patent application Ser. No. 11/444,946, filed on Jun. 1, 2006, published on Apr. 26, 2007, by Robert M. Farrell et al., entitled TECHNIQUE FOR THE GROWTH AND FABRICATION OF SEMIPOLAR (Ga, Al, In, B) N THIN FILMS, HETEROSTRUCTURES, AND DEVICES, which is incorporated by reference herein.

The preferred embodiment presented above have discussed (Ga, Al, In)N thin films, heterostructures, and devices grown on a free-standing nonpolar nitride wafer having a composition lattice matched to the structure to be grown. Free-standing nonpolar nitride wafers may be created by removing a foreign substrate from a thick nonpolar nitride layer, by sawing a bulk nitride ingot or boule into individual nonpolar nitride wafers, or by any other possible crystal growth or wafer manufacturing technique. The scope of this invention includes the growth and fabrication of nonpolar (Ga, Al, In)N thin films, heterostructures, and devices on all possible free-standing nonpolar nitride wafers created by all possible crystal growth methods and wafer manufacturing techniques. The substrate may also be thinned and/or polished in some instances.

Likewise, the (Ga, Al, In)N thin films, heterostructures, and devices discussed above could be grown on a free-standing semipolar nitride wafer having a composition lattice matched to the structure to be grown. Free-standing semipolar nitride wafers may be creating by removing a foreign substrate from a thick semipolar nitride layer, by sawing a bulk nitride ingot or boule into individual semipolar nitride wafers, or by any other possible crystal growth or wafer manufacturing technique. The scope of this invention includes the growth and fabrication of semipolar (Ga, Al, In)N thin films, heterostructures, and devices on all possible free-standing semipolar nitride wafers created by all possible crystal growth methods and wafer manufacturing techniques. The substrate may also be thinned and/or polished in some instances.

Moreover, foreign substrates other than free-standing GaN could be used for nonpolar or semipolar template growth. The scope of this invention includes the growth and fabrication of nonpolar and semipolar (Ga, Al, In)N thin films, heterostructures, and devices on all possible crystallographic orientations of all possible substrates. These substrates include, but are not limited to, silicon carbide, gallium nitride, silicon, zinc oxide, boron nitride, lithium aluminate, lithium niobate, germanium, aluminum nitride, lithium gallate, partially substituted spinels, and quaternary tetragonal oxides sharing the $\gamma$-$LiAlO_2$ structure.

The nonpolar (Ga, Al, In)N devices described above were grown on free-standing GaN wafers. However, the scope of this invention also covers nonpolar or semipolar (Ga, Al, In)N devices grown on nonpolar or semipolar epitaxial laterally overgrown (ELO) templates. The ELO technique is a method of reducing the density of threading dislocations (TD) in subsequent epitaxial layers. Reducing the TD density leads to improvements in device performance. For laser diodes, these improvements include increased output powers, increased internal quantum efficiencies, longer device lifetimes, and reduced threshold current densities. For example, the device of the present invention operates with a threshold current density less than 1 $kA/cm^{-2}$. These advantages will be pertinent to all nonpolar and semipolar planar thin films, heterostructures, and devices grown on semipolar ELO templates.

Variations in (Ga, In, Al)N quantum well and heterostructure design are possible without departing from the scope of the present invention. Moreover, the specific thickness and composition of the layers, the number of quantum wells grown, and the inclusion or omission of electron blocking layers are variables inherent to particular device designs and may be used in alternative embodiments of the present invention. In fact, with the presence of thicker quantum wells in nonpolar devices, the $Al_xGa_{1-x}N$ electron blocking layer may potentially be removed altogether, allowing for a completely Al-free device.

This invention may also be used to produce Al-cladding-free double-heterostructure GaN-based laser diodes that do not contain quantum wells. One example is a laser diode structure containing a GaN/InGaN double heterostructure.

Advantages and Improvements

The present invention offers several advantages over the existing art. GaN-based laser diodes grown on nonpolar substrates are expected to have reduced threshold current densities, longer lifetimes, and higher optical gain. These devices do not suffer from polarization-induced electric fields like their c-plane counterparts, thus eliminating the quantum confined Stark effect. This allows for the implementation of high-gain structures with thicker quantum wells. These thicker quantum wells can be used to effectively confine the optical mode in the device, eliminating the need for Al$_x$Ga$_{1-x}$N/GaN superlattice layers for optical confinement and allowing for Al-cladding-free laser diode structures. Al-cladding-free laser diode structures are expected to be more manufacturable and cheaper than Al-containing structures. They are also expected to offer several technical advantages over the existing art, including higher crystal quality, lower operating voltage, and longer lifetime.

The concept of employing thick quantum wells in a III-nitride based laser diode to achieve optical mode confinement is believed to be new. The concept of a nonpolar III-nitride based laser diode without Al-containing cladding layers is believed to be new. The concept of a double-heterostructure III-nitride based laser diode is believed to be new.

REFERENCES

The following references are incorporated by reference herein:

[1] S. Nakamura, M. Senoh, S. Nagahama, N. Iwasa, T. Yamada, T. Matsushita, H. Kiyoku, Y. Sugimoto, T. Kozaki, H. Umemoto, M. Sano, and K. Chocho, "InGaN/Gan/AlGaN-based laser diodes with modulation-doped strained-layer superlattices grown on an epitaxially laterally grown GaN substrate", Applied Physics Letters, Vol. 72, No. 12, pp. 211-213, Jan. 12, 1998.

[2] T. Asano, T. Tsuyoshi, T. Mizuno, M. Takeya, S. Ikeda, K. Shibuya, T. Hino, S. Uchida, and M. Ikeda, "100-mW kink-free blue-violet laser diodes with low aspect ratio," IEEE Journal of Quantum Electronics, Vol. 39, No. 1, pp. 135-140, January 2003.

[3] S. Uchida, M. Takeya, S. Ikeda, T. Mizuno, T. Fujimoto, O. Matsumoto, S. Goto, T. Tojyo, and M. Ikeda, "Recent progress in high-power blue-violet lasers," IEEE Journal of Selected Topics in Quantum Electronics, Vol. 9, No. 5, pp. 1252-1259, September/October 2003.

[4] F. Bernardini, V. Fiorentini, and D. Vanderbilt, "Spontaneous polarization and piezoelectric constants of III-V nitrides," Physical Review B, Vol. 56, No. 16, pp. 10024-10027, October 1997.

[5] P. Waltereit, O. Brandt, A. Trampert, H. Grahn, J. Menniger, M. Ramsteiner, M. Reiche, and K. Ploog, "Nitride semiconductors free of electrostatic fields for efficient white light-emitting diodes," Nature, Vol. 406, pp. 865-868, August 2000.

[6] U.S. Pat. No. 7,091,514, issued Aug. 15, 2006, to Craven et al., and entitled "NONPOLAR (Al, B, In, Ga)N QUANTUM WELL AND HETEROSTRUCTURE MATERIALS AND DEVICES."

[7] U.S. Patent Publication No. 2005/0214992, published Sep. 29, 2005, by Chakraborty et al., and entitled "FABRICATION OF NONPOLAR INDIUM GALLIUM NITRIDE THIN FILMS, HETEROSTRUCTURES AND DEVICES BY METALORGANIC CHEMICAL VAPOR DEPOSITION."

[8] U.S. Patent Publication No. 2006/0205199, published Sep. 14, 2006, by Baker et al., and entitled "TECHNIQUE FOR THE GROWTH OF PLANAR SEMIPOLAR GALLIUM NITRIDE."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. An optoelectronic device, comprising:
   a nonpolar III-nitride semiconductor light emitting device having at least one nonpolar III-nitride quantum well with a thickness of at least 4 nanometers, wherein the device includes an optical waveguide, but no aluminum-containing waveguide cladding layers.

2. The device of claim 1, wherein the nonpolar III-nitride quantum well has a thickness greater than 4, 5, 6, 7, or 8 nanometers.

3. The device of claim 1, wherein a nonpolar III-nitride quantum well with a thickness of at least 4 nanometers provides greater optical confinement than a nonpolar III-nitride quantum well with a thickness of less than 4 nanometers.

4. The device of claim 1, wherein the nonpolar III-nitride quantum well is part of a quantum well active region that provides sufficient optical confinement for the device's operation.

5. The device of claim 4, wherein the quantum well active region provides sufficient optical confinement for the device's operation in the absence of aluminum-containing waveguide cladding layers.

6. The device of claim 4, wherein the quantum well is an indium-containing quantum well.

7. The device of claim 4, wherein the quantum well active region is the optical waveguide for the device.

8. The device of claim 4, wherein the quantum well active region provides enough material with a high index of refraction to effectively confine an optical mode of the device.

9. The device of claim 1, wherein the device includes a substrate, and the substrate of the device has no substantial effect on the device's optical mode.

10. The device of claim 9, wherein a substrate of the device has an index of refraction lower than the quantum well active region.

11. The device of claim 1, wherein a nonpolar III-nitride is used as a substrate for the device.

12. The device of claim 1, wherein the device operates with a threshold current density less than 1 kA/cm$^{-2}$.

13. A method of fabricating an optoelectronic device, comprising:
   creating a nonpolar III-nitride semiconductor light emitting device having at least one nonpolar III-nitride quantum well with a thickness of at least 4 nanometers, wherein the device includes an optical waveguide, but no aluminum-containing waveguide cladding layers.

14. The method of claim 13, wherein the nonpolar III-nitride quantum well has a thickness greater than 4, 5, 6, 7, or 8 nanometers.

15. The method of claim 13, wherein a nonpolar III-nitride quantum well with a thickness of at least 4 nanometers provides greater optical confinement than a nonpolar III-nitride quantum well with a thickness of less than 4 nanometers.

16. The method of claim 13, wherein the nonpolar III-nitride quantum well is part of a quantum well active region that provides sufficient optical confinement for the device's operation.

17. The method of claim 16, wherein the quantum well active region provides sufficient optical confinement for the device's operation in the absence of aluminum-containing waveguide cladding layers.

18. The method of claim 16, wherein the quantum well is an indium-containing quantum well.

19. The method of claim 16, wherein the quantum well active region is the optical waveguide for the device.

20. The method of claim 16, wherein the quantum well active region provides enough material with a high index of refraction to effectively confine an optical mode of the device.

21. The method of claim 13, wherein the device includes a substrate, and the substrate of the device has no substantial effect on the device's optical mode.

22. The method of claim 13, wherein a substrate of the device has an index of refraction lower than the quantum well active region.

23. The method of claim 13, wherein the device includes a nonpolar III-nitride a substrate.

24. The method of claim 13, wherein the device has a threshold current density less than $1 \text{ kA/cm}^{-2}$.

25. The device of claim 1, wherein the device has no waveguide cladding layers containing any mole fraction of aluminum.

26. The method of claim 13, wherein the device has no waveguide cladding layers containing any mole fraction of aluminum.

* * * * *